(12) United States Patent
Fang et al.

(10) Patent No.: US 12,308,205 B2
(45) Date of Patent: May 20, 2025

(54) BEAM CURRENT ADJUSTMENT FOR CHARGED-PARTICLE INSPECTION SYSTEM

(71) Applicant: ASML NETHERLANDS B.V., Veldhoven (NL)

(72) Inventors: Wei Fang, Milpitas, CA (US); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 155 days.

(21) Appl. No.: 17/785,896

(22) PCT Filed: Dec. 17, 2020

(86) PCT No.: PCT/EP2020/086908
§ 371 (c)(1),
(2) Date: Jun. 15, 2022

(87) PCT Pub. No.: WO2021/123080
PCT Pub. Date: Jun. 24, 2021

(65) Prior Publication Data
US 2023/0028799 A1 Jan. 26, 2023

Related U.S. Application Data

(60) Provisional application No. 62/951,950, filed on Dec. 20, 2019.

(51) Int. Cl.
*H01J 37/24* (2006.01)
*H01J 37/073* (2006.01)
*H01J 37/075* (2006.01)

(52) U.S. Cl.
CPC .......... *H01J 37/243* (2013.01); *H01J 37/073* (2013.01); *H01J 37/075* (2013.01)

(58) Field of Classification Search
CPC ...... H01J 37/243; H01J 37/073; H01J 37/075; H01J 2237/06308; H01J 2237/06325; H01J 2237/06333
See application file for complete search history.

(56) References Cited

U.S. PATENT DOCUMENTS

| 4,460,831 A | 7/1984 | Oettinger et al. |
| 2006/0151696 A1* | 7/2006 | Khursheed ............ H01J 37/265 250/310 |

(Continued)

FOREIGN PATENT DOCUMENTS

| EP | 1735811 A2 | 12/2006 |
| JP | 2004-273419 A | 9/2004 |

(Continued)

OTHER PUBLICATIONS

Bostanjoglo et al, "Producing High-Current Nanosecond Electric Pulses with a Standard Tungsten Hairpin Gun", Journal of Physics E, Scientific Instruments, IOP Publishing, Bristol, GB, vol. 20, No. 12, 1987, p. 1491-1493) in view of Khursheed (US 20060151696 A1 (Year: 1987).*

(Continued)

*Primary Examiner* — David E Smith
(74) *Attorney, Agent, or Firm* — Finnegan, Henderson, Farabow, Garrett & Dunner, LLP

(57) ABSTRACT

Apparatuses, methods, and systems for ultra-fast beam current adjustment for a charged-particle inspection system include an charged-particle source configured to emit charged particles for scanning a sample; and an emission booster configured to configured to irradiate electromagnetic radiation onto the charged-particle source for boosting charged-particle emission in a first cycle of a scanning operation of the charged-particle inspection system, and to (Continued)

stop irradiating the electromagnetic radiation in a second cycle of the scanning operation.

20 Claims, 8 Drawing Sheets

(56) References Cited

U.S. PATENT DOCUMENTS

| | | | |
|---|---|---|---|
| 2007/0228286 A1 | 10/2007 | Lewellen et al. | |
| 2008/0315095 A1 | 12/2008 | Nakasuji et al. | |
| 2019/0108967 A1* | 4/2019 | Loakeimidi | H01J 19/24 |

FOREIGN PATENT DOCUMENTS

| | | |
|---|---|---|
| JP | 2012-028279 A | 2/2012 |
| TW | 201506986 A | 2/2015 |
| TW | 201721701 A | 6/2017 |
| WO | WO 2010/082451 A1 | 7/2010 |
| WO | WO 2019/063530 A1 | 4/2019 |

OTHER PUBLICATIONS

Bostanjoglo et al., "Producing High-Current Nanosecond Electric Pulses with a Standard Tungsten Hairpin Gun", Journal of Physics E, Scientific Instruments, IOP Publishing, Bristol, GB, vol. 20, No. 12, 1987, p. 1491-1493) (Year: 1987).*

Notice of Reasons for Rejection from the Japan Patent Office issued in related Japanese Patent Application No. 2022-532052; mailed Jun. 21, 2023 (13 pgs.).

Office Action issued by the Intellectual Property Office (IPO) in related ROC (Taiwan) Patent Application No. 109144399, mailed Feb. 9, 2022 (13 pgs.).

International Search Report and Written Opinion received from the International Search Authority issued in related International Application No. PCT/EP2020/086908 mailed May 19, 2021 (16 pgs.).

Houdellier et al., "Development of a high brightness ultrafast Transmission Electron Microscope based on a laser-driven cold field emission source," arXiv:1711.04533v1 [physics.ins-det] Nov. 13, 2017 (23 pgs.).

Rosado et al., "A new design for a high-voltage pulsed electron gun," Meas. Sci. Technol. 21 (2010) 027004 (4 pgs.).

Batchelor et al., "A High Current, High Gradient, Laser Excited, Pulsed Electron Gun," Jan. 1998 (3 pgs.).

O Bostanjoglo et al., "Producing high-current nanosecond electron pulses with a standard tungsten hairpin gun," vol. 20, Journal of Physics E Scientific Instruments 1987 1491-1493 (3 pgs.).

Ehberger et al., "Highly coherent electron beam from a laser-triggered tungsten needle tip," arXiv:1412.4584v1 [physics.optics] Dec. 15, 2014 (7 pgs.).

* cited by examiner

BEAM CURRENT ADJUSTMENT FOR CHARGED-PARTICLE INSPECTION SYSTEM

CROSS-REFERENCE TO RELATED APPLICATIONS

This application claims priority to International Application No. PCT/EP2020/086908, filed Dec. 17, 2020, and published as WO 2021/123080 A1, which claims priority of U.S. application 62/951,950 which was filed on Dec. 20, 2019. The contents of these applications are incorporated herein by reference in their entireties.

TECHNICAL FIELD

The present disclosure generally relates to the field of charged-particle inspection systems and, in particular, beam current adjustment for a charged-particle inspection system.

BACKGROUND

In manufacturing processes of integrated circuits (ICs), unfinished or finished circuit components are inspected to ensure that they are manufactured according to design and are free of defects. An inspection system utilizing an optical microscope typically has a resolution down to a few hundred nanometers, and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practical tool for inspecting IC components having a feature size that is sub-100 nanometers. With a SEM, electrons of a single primary charged-particle beam, or electrons of a plurality of primary charged-particle beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments consistent with the present disclosure include apparatuses, systems, and methods for beam current adjustment for a charged-particle inspection system, such as ultra-fast beam current adjustment. In some embodiments, a charged-particle inspection system may include a charged-particle source configured to emit charged particles for scanning a sample. The apparatus may also include an emission booster configured to irradiate electromagnetic radiation onto the charged-particle source for boosting charged-particle emission in a first cycle of a scanning operation of the charged-particle inspection system, and to stop irradiating the electromagnetic radiation in a second cycle of the scanning operation.

In some embodiments, a charged-particle inspection system may include a charged-particle source configured to emit charged particles. The apparatus may also include an emission booster configured to irradiate electromagnetic radiation onto the charged-particle source for boosting charged-particle emission. The apparatus may further include a beam forming unit configured to form a charged-particle beam using the charged particles. The apparatus may further include a scanning unit configured to direct the charged-particle beam to scan a sample line by line. The apparatus may further include a controller including circuitry configured to control the emission booster to irradiate the electromagnetic radiation in a first scan cycle of the charged-particle beam, and to stop irradiating the electromagnetic radiation in a second scan cycle of the charged-particle beam.

In some embodiments, a method may include emitting charged particles for forming a charged-particle beam using a charged-particle source of the charged-particle inspection system. The method may also include directing the charged-particle beam to scan a sample line by line using a scanning unit of the charged-particle inspection system. The method may further include irradiating, using an emission booster of the charged-particle inspection system, electromagnetic radiation onto the charged-particle source for boosting charged-particle emission in a first scan cycle of the charged-particle beam, and stopping irradiating the electromagnetic radiation in a second scan cycle of the charged-particle beam.

In some embodiments, a non-transitory computer-readable medium may store a set of instructions that is executable by at least one processor of a charged-particle inspection system to cause the system to perform a method. The method may include emitting charged particles for forming a charged-particle beam using a charged-particle source of the charged-particle inspection system. The method may also include directing the charged-particle beam to scan a sample line by line using a scanning unit of the charged-particle inspection system. The method may further include irradiating, using an emission booster of the charged-particle inspection system, electromagnetic radiation onto the charged-particle source for boosting charged-particle emission in a first scan cycle of the charged-particle beam, and stopping irradiating the electromagnetic radiation in a second scan cycle of the charged-particle beam.

DETAILED DESCRIPTION

Figure 1:
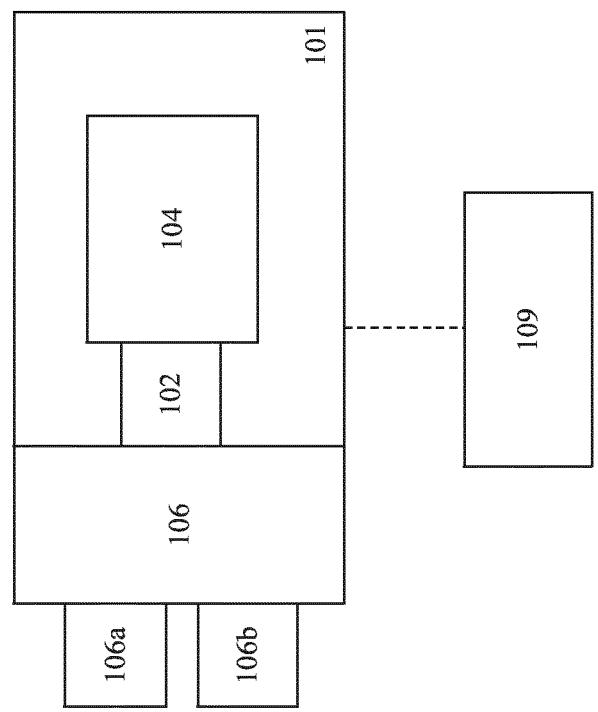
FIG. 1 is a schematic diagram illustrating an exemplary charged-particle beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing charged-particle beams (e.g., electron beams), the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smartphone can be as small as a thumbnail and yet may include over 2 billion transistors, the size of each transistor being less than $1/1000$th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures of the wafer. The image can be used to determine if the structure was formed properly in the proper location. If the structure is defective, then the process can be adjusted, so the defect is less likely to recur.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously and generate images of the structures of the wafer with higher efficiency and faster speed.

Detecting buried defects in vertical high-density structures such as 3D NAND flash memory devices, can be challenging. One of several ways to detect buried or on-surface electrical defects in such devices is by using a voltage contrast method in a SEM. In this method, electrical conductivity differences in materials, structures, or regions of a sample cause contrast differences in SEM images thereof. In the context of defect detection, an electrical defect under the sample surface may generate a charging variation on the sample surface, so the electrical defect can be detected by a contrast in the SEM image of the sample surface. To enhance the voltage contrast, a process called pre-charging or flooding may be employed in which the region of interest of the sample may be exposed to a large beam current before an inspection using a small beam current but high imaging resolution. For the inspection, some of the advantages of flooding may include reduction of charging of the wafer to minimize distortion of images due to the charging, and in some cases, increase of charging of the wafer to enhance difference of defective and surrounding non-defective features in images, among other things.

One way to identify voltage contrast defects is to quickly switch between different beam currents for the electron beam to scan the wafer for multiple times. Multiple voltage contrast images may be generated and compared to identify the voltage contrast defects.

A challenge in existing SEM designs is that the beam current cannot be adjusted in ultra-fast time during the inspection process, and the voltage contrast response of the defected region may recede before the beam current adjustment is completed. For example, when the interconnector is manufactured as subpar, and the electron beam has a low beam current, the external electrons may be drained. If the drainage is faster than the beam current adjustment, no abnormal voltage contrast response may be shown in the voltage contrast image. For another example, when the insulator is manufactured as subpar, and the electron beam has a high beam current, the external electrons may be accumulated quickly to cause electric breakdown and be drained. If the drainage is faster than the beam current adjustment, no abnormal voltage contrast response may be shown in the voltage contrast image. Because the beam current cannot be adjusted in ultra-fast time during the inspection process, the voltage contrast defects may be difficult to identify.

The disclosed embodiments provide apparatuses, systems, and methods that allow ultra-fast beam current adjustment during the inspection process. A charged-particle inspection system (e.g., a SEM) may be equipped with an emission booster configured to irradiate light onto a charged-particle source. Due to photoelectric or photoemission effect, energy of the light may be transferred to electrons of the atoms of the material of the charged-particle source and help them escape from the atoms. Such transfer may happen in ultra-fast time. Thus, the transferred energy may boost electron emission in ultra-fast time. When the electron emission is boosted, the electron beam may have a high current. When the electron emission is not boosted, the electron beam may have a low current. The electron emission of the emission booster may be synchronized to the scanning operation of the charged-particle inspection system such that the charged-particle inspection system may quickly switch between the high and low currents of the electron beam for scanning Correspondingly, two "versions" of voltage contrast images may be generated from the scanning, one version being generated under the high current, the other version being generated under the low beam current. By comparing characteristics (e.g., brightness) of the voltage contrast images generated under different beam currents, voltage contrast responses (e.g., change ratios of exiting electrons) under different beam currents may be identified. If the voltage contrast responses show abnormality, potential voltage contrast defects may be identified in a short time without difficulty.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, a beam tool 104, and an equipment front end module (EFEM) 106. Beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by beam tool 104. Beam tool 104 may be a single-beam system or a multi-beam system.

A controller 109 is electronically connected to beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
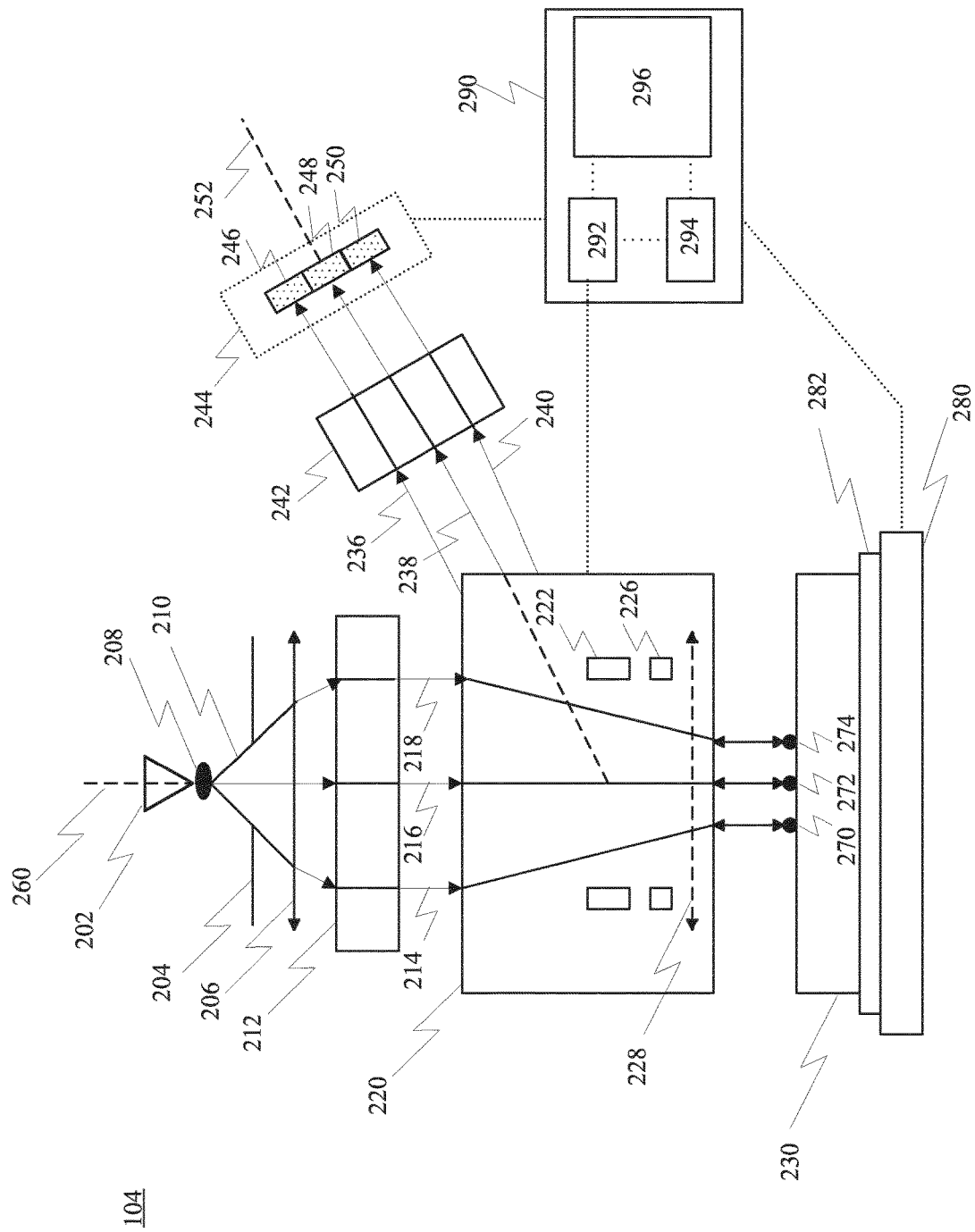
FIG. 2 is a schematic diagram illustrating an exemplary multi-beam beam tool, consistent with embodiments of the present disclosure that can be a part of the exemplary EBI system of FIG. 1.

FIG. 2 illustrates a schematic diagram of an exemplary multi-beam beam tool 104 (also referred to herein as apparatus 104) and an image processing system 290 that may be configured for use in EBI system 100 (FIG. 1), consistent with embodiments of the present disclosure.

Beam tool 104 comprises an charged-particle source 202, a gun aperture 204, a condenser lens 206, a primary charged-particle beam 210 emitted from charged-particle source 202, a source conversion unit 212, a plurality of beamlets 214, 216, and 218 of primary charged-particle beam 210, a primary projection optical system 220, a motorized wafer stage 280, a wafer holder 282, multiple secondary charged-particle beams 236, 238, and 240, a secondary optical system 242, and an charged-particle detection device 244. Primary projection optical system 220 can comprise a beam separator 222, a deflection scanning unit 226, and an objective lens 228. Charged-particle detection device 244 can comprise detection sub-regions 246, 248, and 250.

Charged-particle source 202, gun aperture 204, condenser lens 206, source conversion unit 212, beam separator 222, deflection scanning unit 226, and objective lens 228 can be aligned with a primary optical axis 260 of apparatus 104. Secondary optical system 242 and charged-particle detection device 244 can be aligned with a secondary optical axis 252 of apparatus 104.

Charged-particle source 202 can emit one or more charged particles, such as electrons, protons, ions, muons, or any other particle carrying electric charges. In some embodiments, charged-particle source 202 may be an electron source. For example, charged-particle 202 may include a cathode, an extractor, or an anode, wherein primary electrons can be emitted from the cathode and extracted or accelerated to form primary charged-particle beam 210 (in this case, a primary electron beam) with a crossover (virtual or real) 208. For ease of explanation without causing ambiguity, electrons are used as examples in some of the descriptions herein. However, it should be noted that any charged particle may be used in any embodiment of this disclosure, not limited to electrons. Primary charged-particle beam 210 can be visualized as being emitted from crossover 208. Gun aperture 204 can block off peripheral charged particles of primary charged-particle beam 210 to reduce Coulomb effect. The Coulomb effect may cause an increase in size of probe spots.

Source conversion unit 212 can comprise an array of image-forming elements and an array of beam-limit apertures. The array of image-forming elements can comprise an array of micro-deflectors or micro-lenses. The array of image-forming elements can form a plurality of parallel images (virtual or real) of crossover 208 with a plurality of beamlets 214, 216, and 218 of primary charged-particle beam 210. The array of beam-limit apertures can limit the plurality of beamlets 214, 216, and 218. While three beamlets 214, 216, and 218 are shown in FIG. 2, embodiments of the present disclosure are not so limited. For example, in some embodiments, the apparatus 104 may be configured to generate a first number of beamlets. In some embodiments, the first number of beamlets may be in a range from 1 to 1000. In some embodiments, the first number of beamlets may be in a range from 200-500. In an exemplary embodiment, an apparatus 104 may generate 400 beamlets.

Condenser lens 206 can focus primary charged-particle beam 210. The electric currents of beamlets 214, 216, and 218 downstream of source conversion unit 212 can be varied by adjusting the focusing power of condenser lens 206 or by changing the radial sizes of the corresponding beam-limit apertures within the array of beam-limit apertures. Objective lens 228 can focus beamlets 214, 216, and 218 onto a wafer 230 for imaging, and can form a plurality of probe spots 270, 272, and 274 on a surface of wafer 230.

Beam separator 222 can be a beam separator of Wien filter type generating an electrostatic dipole field and a magnetic dipole field. In some embodiments, if they are applied, the force exerted by the electrostatic dipole field on a charged particle (e.g., an electron) of beamlets 214, 216, and 218 can be substantially equal in magnitude and opposite in a direction to the force exerted on the charged particle by magnetic dipole field. Beamlets 214, 216, and 218 can, therefore, pass straight through beam separator 222 with zero deflection angle. However, the total dispersion of beamlets 214, 216, and 218 generated by beam separator 222 can also be non-zero. Beam separator 222 can separate secondary charged-particle beams 236, 238, and 240 from beamlets 214, 216, and 218 and direct secondary charged-particle beams 236, 238, and 240 towards secondary optical system 242.

Deflection scanning unit 226 can deflect beamlets 214, 216, and 218 to scan probe spots 270, 272, and 274 over a surface area of wafer 230. In response to the incidence of beamlets 214, 216, and 218 at probe spots 270, 272, and 274, secondary charged-particle beams 236, 238, and 240 may be emitted from wafer 230. Secondary charged-particle beams 236, 238, and 240 may comprise charged particles (e.g., electrons) with a distribution of energies. For example, secondary charged-particle beams 236, 238, and 240 may be secondary electron beams including secondary electrons (energies ≤50 eV) and backscattered electrons (energies between 50 eV and landing energies of beamlets 214, 216, and 218). Secondary optical system 242 can focus secondary charged-particle beams 236, 238, and 240 onto detection sub-regions 246, 248, and 250 of charged-particle detection device 244. Detection sub-regions 246, 248, and 250 may be configured to detect corresponding secondary charged-particle beams 236, 238, and 240 and generate corresponding signals (e.g., voltage, current, etc.) used to reconstruct an image of surface area of wafer 230.

The generated signals may represent intensities of secondary charged-particle beams 236, 238, and 240 and may provide the signals to image processing system 290 in communication with charged-particle detection device 244, primary projection optical system 220, and motorized wafer stage 280. The movement speed of motorized wafer stage 280 may be adjusted to adjust the time intervals between consecutive beam scans of an area on wafer 230. The time intervals may need to be adjusted due to different materials on wafer 230 having different resistance-capacitance characteristics, thereby exhibiting varying sensitivity to imaging timing.

The intensity of secondary charged-particle beams 236, 238, and 240 may vary according to the external or internal structure of wafer 230, and thus may indicate whether wafer 230 includes defects. Moreover, as discussed above, beamlets 214, 216, and 218 may be projected onto different locations of the top surface of wafer 230, or different sides of wafer 230 at a particular location, to generate secondary charged-particle beams 236, 238, and 240 of different intensities. Therefore, by mapping the intensity of secondary charged-particle beams 236, 238, and 240 with the areas of wafer 230, image processing system 290 may reconstruct an image that reflects the characteristics of internal or external structures of wafer 230.

In some embodiments, image processing system 290 may include an image acquirer 292, a storage 294, and a controller 296. Image acquirer 292 may comprise one or more processors. For example, image acquirer 292 may comprise a computer, server, mainframe host, terminals, personal computer, any kind of mobile computing devices, and the like, or a combination thereof. Image acquirer 292 may be communicatively coupled to charged-particle detection device 244 of beam tool 104 through a medium such as an electric conductor, optical fiber cable, portable storage media, IR, Bluetooth, internet, wireless network, wireless radio, or a combination thereof. In some embodiments, image acquirer 292 may receive a signal from charged-particle detection device 244 and may construct an image. Image acquirer 292 may thus acquire images of wafer 230. Image acquirer 292 may also perform various post-processing functions, such as generating contours, superimposing indicators on an acquired image, and the like. Image acquirer 292 may be configured to perform adjustments of brightness and contrast of acquired images. In some embodiments, storage 294 may be a storage medium such as a hard disk, flash drive, cloud storage, random access memory (RAM), other types of computer-readable memory, and the like. Storage 294 may be coupled with image acquirer 292 and may be used for saving scanned raw image data as original images, and post-processed images. Image acquirer 292 and storage 294 may be connected to controller 296. In some embodiments, image acquirer 292, storage 294, and controller 296 may be integrated together as one control unit.

In some embodiments, image acquirer 292 may acquire one or more images of a wafer based on an imaging signal received from charged-particle detection device 244. An imaging signal may correspond to a scanning operation for conducting charged particle imaging. An acquired image may be a single image comprising a plurality of imaging areas. The single image may be stored in storage 294. The single image may be an original image that may be divided into a plurality of regions. Each of the regions may comprise one imaging area containing a feature of wafer 230. The acquired images may comprise multiple images of a single imaging area of wafer 230 sampled multiple times over a time sequence. The multiple images may be stored in storage 294. In some embodiments, image processing system 290 may be configured to perform image processing steps with the multiple images of the same location of wafer 230.

In some embodiments, image processing system 290 may include measurement circuitries (e.g., analog-to-digital converters) to obtain a distribution of the detected secondary charged particles (e.g., secondary electrons). The charged-particle distribution data collected during a detection time window, in combination with corresponding scan path data of beamlets 214, 216, and 218 incident on the wafer surface, can be used to reconstruct images of the wafer structures under inspection. The reconstructed images can be used to reveal various features of the internal or external structures of wafer 230, and thereby can be used to reveal any defects that may exist in the wafer.

In some embodiments, the charged particles may be electrons. When electrons of primary charged-particle beam 210 are projected onto a surface of wafer 230 (e.g., probe spots 270, 272, and 274), the electrons of primary charged-particle beam 210 may penetrate the surface of wafer 230 for a certain depth, interacting with particles of wafer 230. Some electrons of primary charged-particle beam 210 may elastically interact with (e.g., in the form of elastic scattering or collision) the particles of wafer 230 and may be reflected or recoiled out of the surface of wafer 230. An elastic interaction conserves the total kinetic energies of the bodies (e.g., electrons of primary charged-particle beam 210 and particles of wafer 230) of the interaction, in which the kinetic energy of the interacting bodies does not convert to other forms of energy (e.g., heat, electromagnetic energy, etc.). Such reflected electrons generated from elastic interaction may be referred to as backscattered electrons (BSEs). Some electrons of primary charged-particle beam 210 may inelastically interact with (e.g., in the form of inelastic scattering or collision) the particles of wafer 230. An inelastic interaction does not conserve the total kinetic energies of the bodies of the interaction, in which some or all of the kinetic energy of the interacting bodies convert to other forms of energy. For example, through the inelastic interaction, the kinetic energy of some electrons of primary charged-particle beam 210 may cause electron excitation and transition of atoms of the particles. Such inelastic interaction may also generate electrons exiting the surface of wafer 230, which may be referred to as secondary electrons (SEs). Yield or emission rates of BSEs and SEs depend on, e.g., the material under inspection and the landing energy of the electrons of primary charged-particle beam 210 landing on the surface of the material, among others. The energy of the electrons of primary charged-particle beam 210 may be imparted in part by its acceleration voltage (e.g., the acceleration voltage between the anode and cathode of charged-particle source 202 in FIG. 2). The quantity of BSEs and SEs may be more or fewer (or even the same) than the injected electrons of primary charged-particle beam 210.

The images generated by SEM may be used for defect inspection. For example, a generated image capturing a test device region of a wafer may be compared with a reference image capturing the same test device region. The reference image may be predetermined (e.g., by simulation) and include no known defect. If a difference between the generated image and the reference image exceeds a tolerance level, a potential defect may be identified. For another example, the SEM may scan multiple regions of the wafer, each region including a test device region designed as the same, and generate multiple images capturing those test device regions as manufactured. The multiple images may be compared with each other. If a difference between the multiple images exceeds a tolerance level, a potential defect may be identified.

Voltage contrast defect is one of the many various types of defects. Test device regions of a wafer may be designed and manufactured in three dimensions, such as having different layers. Some test device regions of different layers may be designed as electrically interconnected, such as being connected by conductive contacts ("interconnectors"). Some test device regions of different layers may be designed as electrically insulated, such as being filled with non-conductive or insulating materials ("insulators") in between (i.e., with no designed interconnectors in between). However, due to fluctuations in the manufacturing process, a designed interconnector may be manufactured as non-conductive or subpar (e.g., being conductive but having high resistance). Similarly, a designed insulator may be manufactured as conductive (e.g., forming a non-designed interconnector) or subpar (e.g., being insulating but having low breakdown voltage). When under inspection, those defects may be sensitive to the energy of the charged-particle beam that reaches the surface of the test device region ("landing energy"), the amount of the charged particles in the charged particle beam ("beam current"), or other inspection conditions. Different landing energies or beam currents of the charged particle beam may cause the defected region to have different response ("voltage contrast response"), such as different yield rates of exiting charged particles, different changes of the yield rate of the exiting charged particles, or the like. Different voltage contrast responses may cause different contrast levels in the generated image. The contrast levels may display the defect as being brighter or darker than surrounding regions, or indistinguishable from the surrounding regions. Thus, this kind of defect is referred to as "voltage contrast defect," and images showing a voltage contrast response is referred to as a "voltage contrast image."

When an interconnector is manufactured as designed, and the charged particle beam is projected to a surface connected to an underneath layer by the interconnector, the underneath layer may function as an electric ground ("well-grounded") to drain the external charged particles brought into the wafer by the charged particle beam. However, when the interconnector is manufactured as non-conductive or subpar, the underneath layer may not be well-grounded, and the external charged particles may not be drained at all or as fast as in the well-grounded scenario. Similarly, when an insulator is manufactured as designed, and the charged particle beam is projected to a surface insulated to an underneath layer, the underneath layer may be well insulated, and no external charged particle would be drained. However, when the insulator is manufactured as conductive or subpar, the underneath layer may be completely grounded or have a low breakdown voltage, and the external charged particles may be drained immediately or after the low breakdown voltage is reached. Compared with the normal interconnectors or insulators, the defected ones may cause abnormal voltage contrast response, and the voltage contrast images of the defected interconnectors or insulators may be different (e.g., brighter or darker) from that of the normal interconnectors or insulators.

Figure 3:
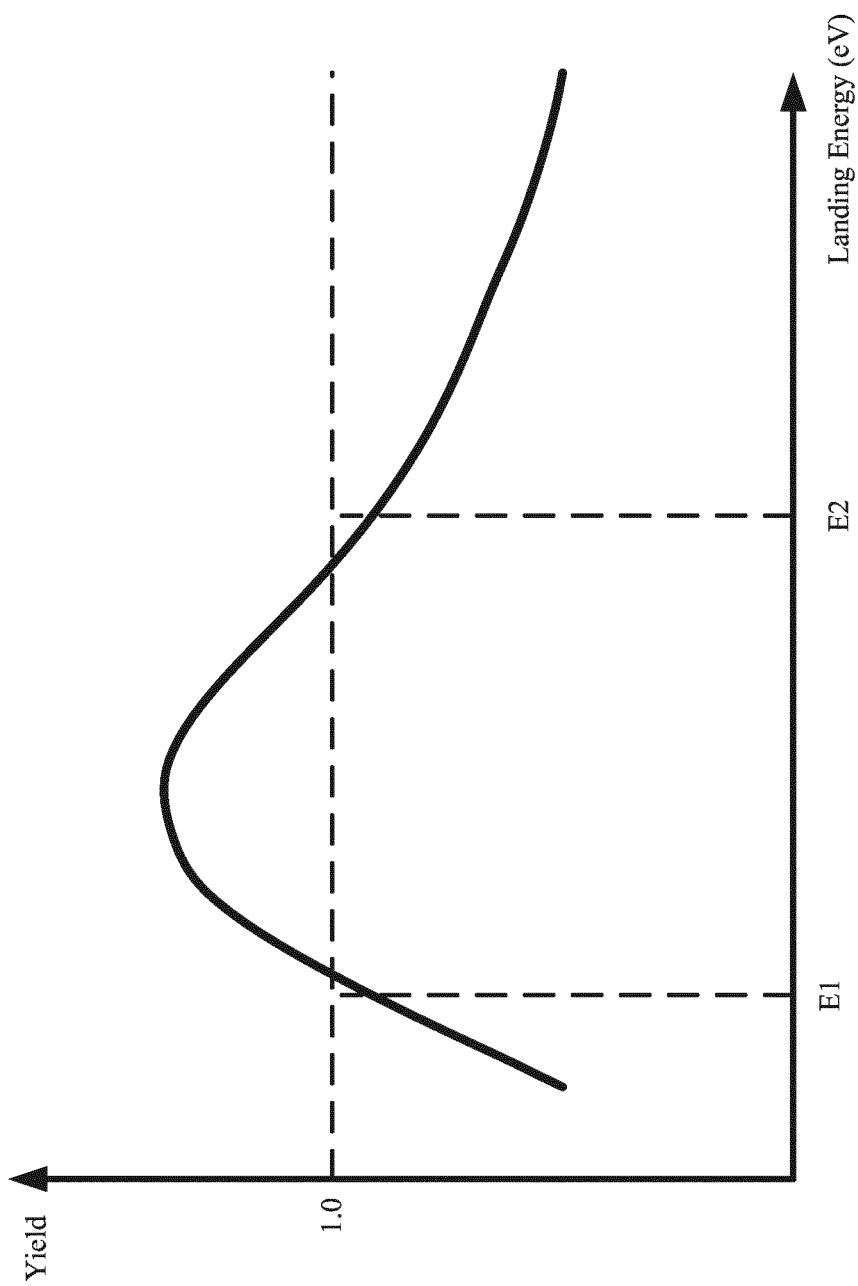
FIG. 3 is an exemplary graph showing a yield of secondary electrons relative to landing energy of primary electrons, consistent with embodiments of the present disclosure.

FIG. 3 illustrates an exemplary graph showing a yield rate of secondary electrons relative to landing energy of primary electron beamlets, consistent with embodiments of the present disclosure. The graph illustrates the relationship of the landing energy of a plurality of beamlets of a primary charged-particle beam (e.g., plurality of beamlets 214, 216, and 218 of primary charged-particle beam 210 of FIG. 2) and the yield rate of secondary charged-particle beams (e.g., secondary charged-particle beams 236, 238, and 240 of FIG. 2). The yield rate indicates the number of secondary electrons that are produced in response to the impact of the primary electrons. For example, a yield rate greater than 1.0 indicates that more secondary electrons may be produced than the number of primary electrons that have landed on the wafer. Similarly, a yield rate of less than 1.0 indicates that fewer secondary electrons may be produced in response to the impact of the primary electrons.

As shown in the graph of FIG. 3, when the landing energy of the primary electrons is within a range from E1 to E2, more electrons may leave the surface of the wafer than land onto the surface of the wafer, which may result in a positive electric potential at the surface of the wafer. In some embodiments, defect inspection may be performed in the foregoing range of landing energies, which is called "positive mode." In the positive mode, secondary electrons that leave the surface may be attracted by the positive electric potential of the surface. The more positive the surface potential is, the fewer secondary electrons may arrive at a detection device (e.g., detection device 244 of FIG. 2), and the darker image an beam tool (e.g., multi-beam beam tool 104 of FIG. 2) may generate for the inspected surface.

When the landing energy is lower than E1 or higher than E2, fewer electrons may leave the surface of the wafer, thereby resulting in a negative electric potential at the surface of the wafer. In some embodiments, defect inspection may be performed in this range of the landing energies, which is called "negative mode." In the negative mode, secondary electrons that leave the surface may be repelled by the negative electric potential of the surface. The more negative the surface potential is, the more secondary electrons may arrive at the detection device, and the brighter image the beam tool may generate for the inspected surface.

In some embodiments, the landing energy of the primary charged-particle beams may be controlled by the total bias or voltage between the charged-particle source and the wafer.

Figure 4A:
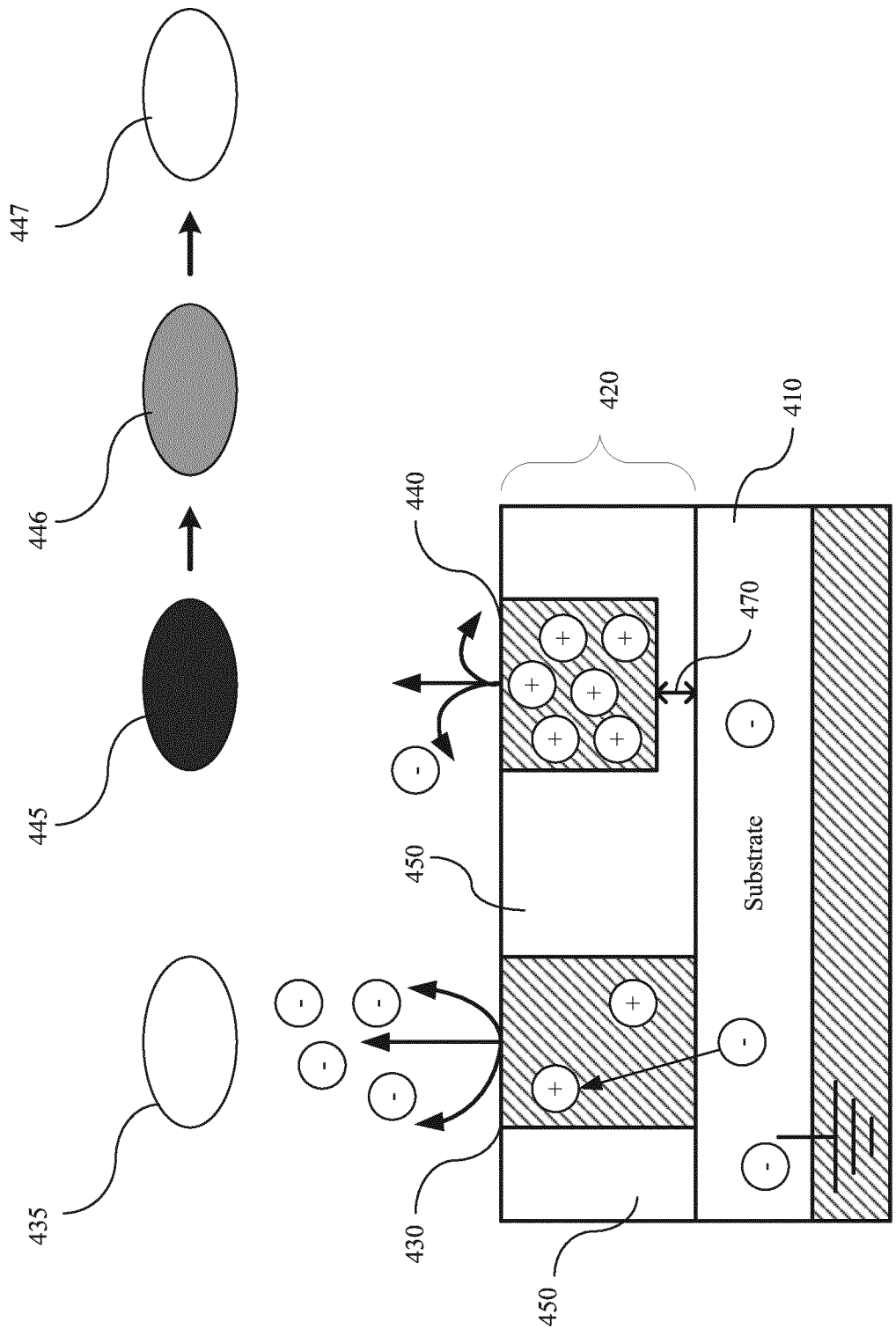
FIG. 4A is a schematic diagram illustrating voltage contrast response of a wafer, consistent with embodiments of the present disclosure.

FIG. 4A illustrates a schematic diagram of a voltage contrast response of a wafer, consistent with embodiments of the present disclosure. In some embodiments, an beam tool (e.g., multi-beam beam tool 104 of FIG. 2) may be used to detect defects in internal or external structures of a wafer (e.g., wafer 230 of FIG. 2) by illuminating the wafer with a plurality of beamlets of a primary charged-particle beam (e.g., plurality of beamlets 214, 216, and 218 of primary charged-particle beam 210 of FIG. 2) and measuring a voltage contrast response of the wafer to the illumination. In some embodiments, the wafer may comprise a test device region 420 that is manufactured on a substrate 410. Substrate 410 may be conductive and grounded. In some embodiments, structure 420 may include multiple conductive structures, including structures 430 and 440 separated by insulating material 450. For example, test device region 430 may be conductively connected to substrate 410. In contrast, test device region 440 is separated from substrate 410 by insulating material 450 such that an insulator test device region 470 (e.g., oxide) exists between test device region 440 and substrate 410.

The beam tool may generate secondary electrons (e.g., secondary charged-particle beams 236, 238, and 240 of FIG. 2) from the surface of test device region 420 by scanning the surface of test device region 420 with a plurality of beamlets of a primary charged-particle beam (e.g., plurality of beamlets 214, 216, and 218 of primary charged-particle beam 210 of FIG. 2). As explained above, when the landing energy of the primary electrons is between $E_1$ and $E_2$ (i.e., in the positive mode), more electrons may leave the surface of the wafer than land on the surface, thereby resulting in a positive electric potential at the surface of the wafer.

As shown in FIG. 4A, a positive electric potential may build-up at the surface of a wafer. For example, after a beam tool scans test device region 420, test device region 440 may retain more positive charges because test device region 440 is insulated from substrate 410, thereby resulting in a positive electric potential at the surface of test device region 440. In contrast, primary electrons with the same landing energy (i.e., the same yield rate) applied to test device region 430 may result in fewer positive charges retained in test device region 430 because substrate 410 may supply electrons to test device region 430 to neutralize the positive charges through the conductive contact between them.

An image processing system (e.g., image processing system 290 of FIG. 2) of an beam tool (e.g., multi-beam beam tool 104 of FIG. 2) may generate images showing voltage contrast responses ("voltage contrast images"), such as voltage contrast images 435 and 445, corresponding to test device regions 430 and 440, respectively. For example, because of its conductive interconnection to substrate 410 (i.e., as the ground), test device region 430 may retain few positive charges and repel more secondary electrons during the inspection. As a result, voltage contrast image 435 may be a bright image. In contrast, because of its insulation from substrate 410 or any other ground, test device region 440 may retain a build-up of positive charges that may cause test device region 440 to repel fewer secondary electrons during inspection. As a result, voltage contrast image 445 may be a dark image.

In some embodiments, the beam tool may pre-scan the surface of a wafer to supply electrons to build up the electric potential on the surface of the wafer. The pre-scanning may use a high-current primary charged-particle beam. After pre-scanning, the beam tool may obtain images of multiple dies within the wafer using a low-current primary charged-particle beam. Because the dies may include identical test device regions, defects may be detected by comparing the differences in voltage contrast images from multiple dies, which is referred to as a die-to-die ("D2D") inspection method. For example, if the voltage contrast response (e.g., image brightness) of one image is different from the voltage contrast response of the other images, the die corresponding to the different voltage contrast response may have a potential defect.

Pre-scanning may be applied to the wafer under the assumption that the electric surface potential built-up on the surface of the wafer during pre-scanning will be retained during the inspection and will remain above the detection threshold of the beam tool. However, in some cases, the built-up surface potential level may change during inspection due to the effects of electric breakdown or tunneling, which may cause failure to detect voltage contrast defects.

For example, test device region 440 (e.g., a tungsten plug) and substrate 410 (a source or drain area of a field-effect transistor (FET)) may be designed as conductively interconnected similar to test device region 430 and substrate 410. However, due to fluctuations in the manufacturing process (e.g., a defective etching process), test device region 440 may be manufactured as subpar, in which insulator test device region 470 (e.g., a thin oxide layer) may form between test device region 440 and substrate 410. For example, the oxide layer may be a cobalt silicide (e.g., CoSi, CoSi2, Co2Si, Co3Si, etc.) layer thinner than 10 nanometers. This is a defect to be detected. However, during the pre-scanning, a high voltage may be applied to the thin insulator test device region 470 and cause electric breakdown, in which leakage current may flow through the thin insulator test device region 470 (i.e., electrons in substrate 410 may drain into test device region 440 through the subpar insulator test device region 470), and test device region 440 may be neutralized. As a result, voltage contrast image 445 may be brighter than it is supposed to be. If the electron drainage process is fast enough, test device region 440 may have been neutralized after the pre-scanning and before the imaging process, which may cause voltage contrast image 445 indistinguishable from voltage contrast image 435. Because of the fast drainage of electrons, if the beam tool cannot adjust the beam currents faster (e.g., quickly switching from pre-scanning to imaging), the defected test device region 440 may not be detected.

Voltage contrast images 445, 446, and 447 illustrate different voltage contrast responses of the defected test device region 440 in a scenario that the beam tool provides ultra-fast beam current adjustment. The beam tool may image test device region 440 for multiple times. As FIG. 4A shows, over time, test device region 440 is gradually neutralized, and the resulting voltage contrast images may gradually change from dark to bright. After a certain period of time, voltage contrast image 447 may become indistinguishable from voltage contrast image 435.

A challenge in detecting such voltage contrast defects is that existing beam tools may not adjust beam currents fast enough in the above-described pre-scanning and imaging process. In the existing beam tools, a beam current may be controlled by charged-particle source (e.g., charged-particle source 202 in FIG. 2) and a gun aperture (e.g., gun aperture 204 in FIG. 2). The beam current may be adjusted by adjusting the size of the gun aperture, the emission rate of the charged-particle source, or both. However, such adjustment of the gun aperture or the charged-particle source may be very slow. Moreover, such adjustments cannot be made during the imaging process. By failing to provide ultra-fast beam current adjustments, existing beam tools may fail to provide capability to detect the aforementioned voltage contrast defects in a timely manner and low cost.

It is appreciated to those skilled in the art that the bright and dark appearances of the images may be changed or reversed depending on the actual processing of the test device regions or the beam tool settings.

Figure 4B:
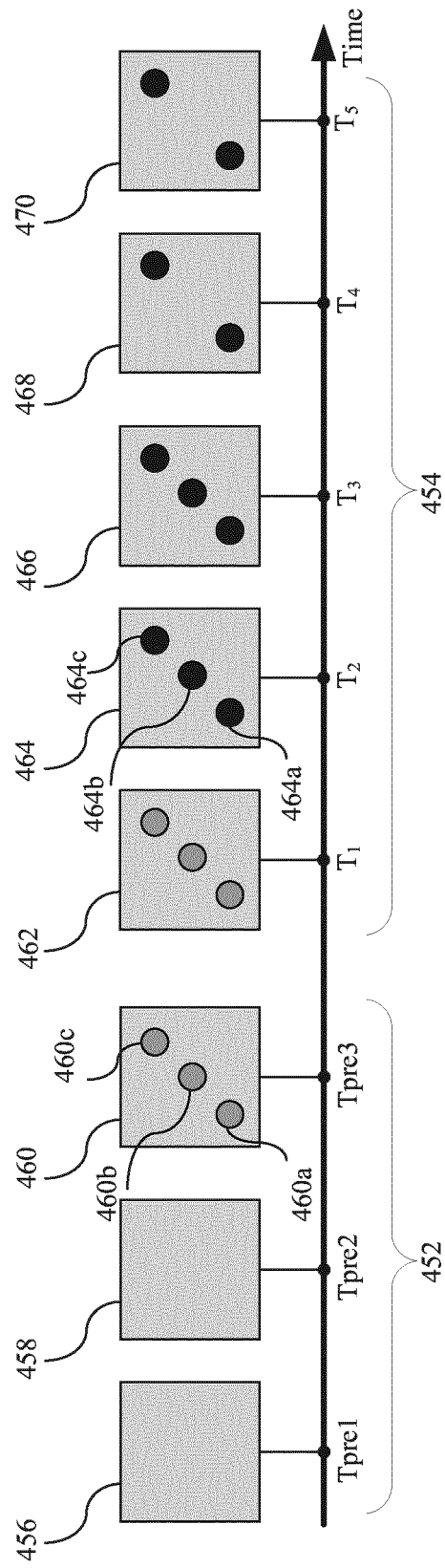
FIG. 4B is an illustration of exemplary voltage contrast images over a time sequence, consistent with embodiments of the present disclosure.

FIG. 4B illustrates exemplary voltage contrast images over a time sequence, consistent with embodiments of the present disclosure. FIG. 4B shows a pre-scanning and imaging process in wafer inspection including a pre-scanning stage 452 and an inspection stage 454. During pre-scanning stage 452, a beam tool (e.g., EBI 104 of FIG. 2) may apply electrons to a surface area of the wafer to build up the electrical potential (referred to as "charging" for simplicity) on the surface area. The beam tool may use one or more high-current beams to charge the surface area and construct voltage contrast images of the surface area based on its voltage contrast response. During inspection stage 454, the EBI system may construct one or more voltage contrast images of the surface area using one or more low-current beams for scanning. The scanning may be repeated for multiple times for generating a series of voltage contrast images showing voltage contrast responses of the surface area in a time sequence. The EBI system may detect a change in electrical potential on the surface area over time by comparing multiple voltage contrast images of the same surface area at different times, which may indicate the existence of a device defect.

In some embodiments, voltage contrast images may be constructed by a multi-beam EBI system. For example, a motorized stage may position the wafer such that a first beamlet of a primary charged-particle beam (e.g., primary charged-particle beam 210 of FIG. 2) may pre-scan a surface area of the wafer at a time Tpre1. The motorized stage may then position the wafer such that a second beamlet of the primary charged-particle beam may pre-scan the same surface area of the wafer at a time Tpre2. The first and second beamlet may have a high current. At Tpre1 and Tpre2, the electrical potential of the surface area may not be high enough to show any regions having detectable voltage contrast responses, as shown in voltage contrast images 456 and 458 constructed using the first and second beamlets, respectively. At the end of pre-scanning stage 452, the motorized stage may position the wafer such that a third beamlet (e.g., also having a high current) of the primary charged-particle beam may pre-scan the surface area at a time Tpre3. A voltage contrast image 460 may be constructed using the third beamlet. As shown in voltage contrast image 460, dark voltage contrast (DVC) regions 460a, 460b, and 460c may appear at the end of pre-scanning stage 452.

After pre-scanning stage 452, fourth, fifth, sixth, seventh, eighth, or more beamlets of the primary charged-particle beam may scan the same pre-charged surface area at times T1, T2, T3, T4, and T5, respectively. As shown in FIG. 4B, the beam tool may construct voltage contrast images 462, 464, 466, 468, and 470 using the fourth, fifth, sixth, seventh, and eight beamlets, respectively. While the example illustrates that eight or more beamlets could be used, it is appreciated that less than eight beamlets could be used. For example, it is appreciated that a single beamlet could take multiple images of the surface area.

At times T1, voltage contrast image 462 shows three DVC regions 460a, 460b, and 460c present on the surface area of the wafer. DVC regions 460a, 460b, and 460c may represent the electrical surface potential built-up in a device structure of the pre-scanned surface area. At times T2 and T3, voltage contrast images 464 and 466 show that DVC regions 464a, 464b, and 464c, which may indicate that the built-up positive charges remained in the device structure and unchanged from times Tpre3 and T1.

At times T4 and T5, voltage contrast images 468 and 470 shows that DVC region 464b disappears while DVC regions 464a and 464c are still present, indicating that the corresponding device structure for DVC region 464b may have lost the built-up positive charges due to leakage current, thereby resulting in a surface potential of DVC region 464b dropping to a non-detectable level (e.g., due to electric breakdown). For example, the positive charge built-up at the corresponding device structure for DVC region 464b may have neutralized due to electric breakdown through a thin device structure defect (see, e.g., insulator structure 470 of FIG. 4A).

The beam tool may adjust the time intervals (e.g., the time span between $T_1$ and $T_2$) such that beamlets of the primary charged-particle beam may scan a surface area of a wafer more or less frequently. For example, a time interval may be as short as 5 ns such that the signal difference from subtle voltage contrast defects can be obtained, thereby increasing the sensitivity of voltage contrast wafer inspection. Advantageously, the beam tool may compare voltage contrast images 456, 458, 460, 462, 464, 466, 468, 470, or more images of the same surface area of the wafer to detect the changes of DVC regions over a time sequence and identify device structure defects.

Although FIG. 4B illustrates three pre-scan voltage contrast images and five inspection voltage contrast images obtained from the beam tool, it is appreciated that any number of images may be used to detect device structure defects in a wafer. Furthermore, although the voltage contrast images shown in FIG. 4B illustrates the detection mechanism using dark voltage contrast, it is appreciated that bright voltage contrast may also be used when the beam tool operates in the negative mode. For example, in some embodiments, the wafer may have a positive surface potential due to the beam tool operating in the positive mode (e.g., E1<Landing Energy <E2). In some embodiments, the wafer may have a negative potential due to the beam tool operating in the negative mode (e.g., Landing Energy <E1 or Landing Energy >E2).

A challenge in the pre-scanning and imaging process as shown in FIG. 4B is that the beam current is difficult to be switched from a high current to a low current between pre-scanning stage 452 and inspection stage 454. That is, the current switching may take a long time between Tpre3 and T1. In such a situation, surface potentials of some regions (e.g., DVC region 464b) may drop to a non-detectable level between $T_{pre3}$ and $T_1$, and thus become non-detectable from the beginning of the inspection stage (e.g., inspection stage 454).

Figure 5:
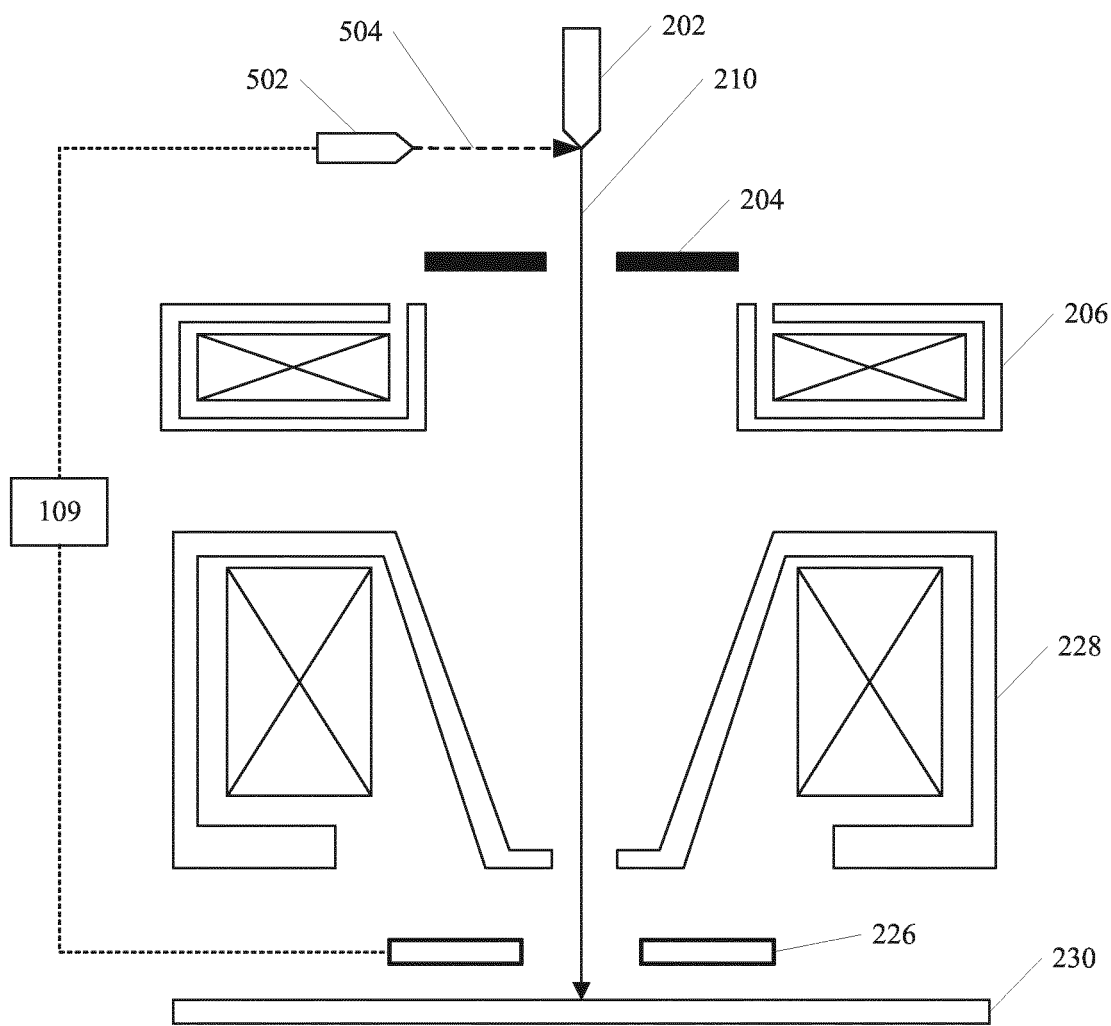
FIG. 5 is a schematic diagram illustrating an exemplary beam tool with capability of ultra-fast beam current adjustment, consistent with embodiments of the present disclosure.

FIG. 5 is a schematic diagram illustrating an exemplary beam tool 500 with capability of ultra-fast beam current adjustment, consistent with embodiments of the present disclosure. Beam tool 500 may be a single-beam tool (e.g., a single-beam SEM) or a multi-beam tool (e.g., beam tool 104 in FIG. 2). For example, beam tool 500 may include a beam forming unit. The beam forming unit may focus and form a single electron beam or may focus and form a plurality of electron beams (or "beamlets"). For example, the beam forming unit may be or may include source conversion unit 212 for forming multiple beams. For a concise explanation, FIG. 5 does not show every component of beam tool 500, and components having the same numbering as in FIGS. 1-2 represent the same or similar components having the same or similar functions as previously described, including controller 109, charged-particle source 202, gun aperture 204, condenser lens 206, primary charged-particle beam 210, deflection scanning unit 226, objective lens 228, and wafer 230. It should be noted that beam tool 500 may include more components, such as a detection system (e.g., including secondary optical system 242 and detection device 244), an imaging processing system (e.g., image processing system 290), other components of a primary optical system (e.g., primary projection optical system 220), or the like. It should also be noted that beam tool 500 may arrange the components in different ordering. For example, deflection scanning unit 226 may be either upstream (as in FIG. 2) or downstream (as in FIG. 5) from objective lens 228. This disclosure does not limit the number, type, or arrangement of the components of beam tool 500.

Beam tool 500 further includes an emission booster 502. Controller 109 may control emission booster 502 and deflection scanning unit 226 to enable beam tool 500 for ultra-fast beam current adjustment.

In FIG. 5, charged-particle source 202 may be configured to emit electrons. In some embodiments, the charged-particle source may be a thermionic charged-particle source or a cold-field emission charged-particle source. Emission booster 502 may irradiate electromagnetic radiation 504 onto charged-particle source 202 for boosting electron emission. Electromagnetic radiation 504 may be an electromagnetic wave having a wavelength, such as, for example, radio waves (e.g., long waves, short waves, or microwaves), infrared rays, visible rays, ultraviolet rays, X-rays, gamma rays, or the like. In some embodiments, electromagnetic radiation 504 may be one or more directional rays of electromagnetic waves (e.g., a beam of visible light). In some embodiments, electromagnetic radiation 504 may be a laser. For example, charged-particle source 202 may include a photocathode, which may emit more electrons under irradiation of electromagnetic radiation 504 due to photoelectric or photoemission effect. In some embodiments, emission booster 502 may be a laser generator configured to irradiate a laser (e.g., a Nd:YAG laser). In some embodiments, the laser may be a free-electron laser (FEL). In some embodiments, the laser may be a pulse laser (e.g., each pulse having a duration shorter than 100 nanoseconds, such as a femtosecond laser). For example, the laser generator may be configured to irradiate the laser onto the photocathode for increasing electrons emitted by the photocathode. In some embodiments, the laser may boost electron emission in ultra-fast time (e.g., within 100 nanoseconds such as 10, 20, 40, 60 nanoseconds or the like) when the laser generator irradiates the laser onto the photocathode. Controller 109 may control emission booster 502 to irradiate electromagnetic radiation 504 while controller 109 controls deflection scanning unit 226 to scan a sample (e.g., wafer 230). For example, controller 109 may control emission booster 502 to irradiate electromagnetic radiation 504 in a first cycle of a scanning operation of deflection scanning unit 226, and to stop irradiating electromagnetic radiation 504 in a second cycle of the scanning operation. The first cycle of the scanning operation may occur before or after the second cycle of the scanning operation.

Figure 6:
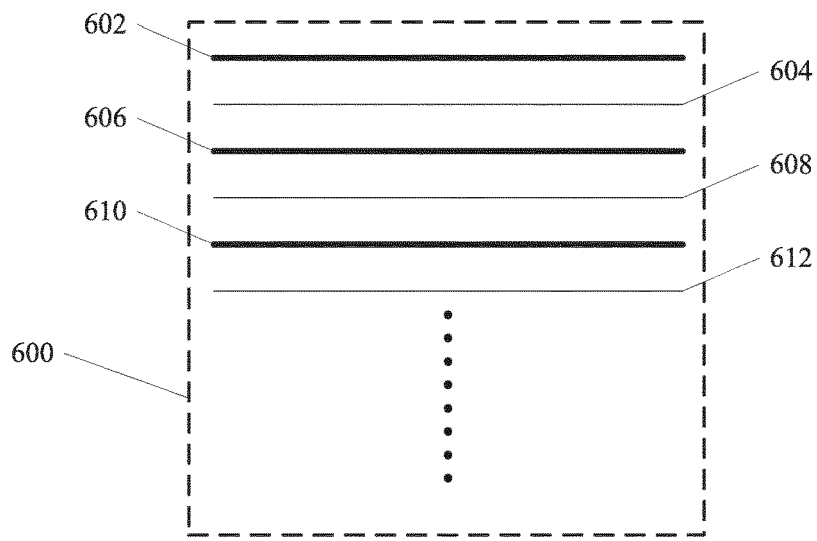
FIG. 6 is an illustration of an exemplary scan frame showing scan lines, consistent with embodiments of the present disclosure.

In some embodiments, the deflection scanning unit 226 may direct primary charged-particle beam 210 (or a plurality of beamlets 214, 216, and 218 of primary charged-particle beam 210) to perform a frame scanning, in which a region (e.g., a rectangular region) of wafer 230 may be scanned line by line. FIG. 6 is an illustration of an exemplary frame 600 showing scan lines, consistent with embodiments of the present disclosure. Frame 600 may be a region of a surface of wafer 230 and may include multiple scan lines, including lines 602-612. In some embodiments, frame 600 may be scanned in a raster manner. For example, deflection scanning unit 226 may direct primary charged-particle beam 210 to start scanning from left to right along line 602. After completing scanning line 602, deflection scanning unit 226 may direct primary charged-particle beam 210 to move back to the left end and prepare to start scanning to the right along line 602 (e.g., for repeated line scan) or line 604 (e.g., for a new line scan). In some embodiments, frame 600 may be scanned in a "head-to-tail" manner. For example, deflection scanning unit 226 may direct primary charged-particle beam 210 to start scanning from left to right along line 602. After completing scanning line 602, the deflection scanning unit 226 may prepare to direct primary charged-particle beam 210 to start scanning from right to left along line 602 (e.g., for repeated line scan) or line 604 (e.g., for a new line scan). It should be noted that this disclosure does not limit the scanning manner for frame scanning.

In some embodiments, controller 109 may control emission booster 502 to scan the same line (e.g., line 602 in FIG. 6) of the sample in the first cycle and the second cycle. That is, deflection scanning unit 226 may direct primary charged-particle beam 210 to scan line 602 for twice, first time with boosted electron emission of charged-particle source 202 and second time without the boosted electron emission. In some embodiments, controller 109 may control emission booster 502 to scan a first line of a sample in the first cycle and to scan a second line of the sample in the second cycle. For example, the first line and the second line may be neighboring lines of a frame for scanning, such as lines 602 and 604 in FIG. 6, respectively. That is, deflection scanning unit 226 may direct primary charged-particle beam 210 to scan lines of frame 600 in an alternate manner with boosted electron emission switched on and off.

Figure 7A:
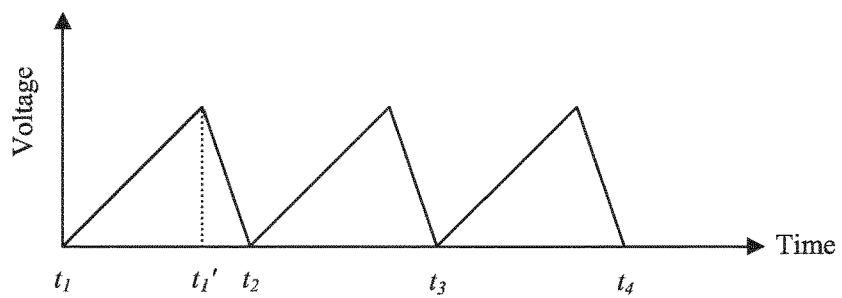
FIG. 7A is an illustration of an exemplary scanning frequency of a beam tool, consistent with embodiments of the present disclosure.

In some embodiments, a length of the first cycle may be substantially equal to a length of the second cycle. For example, the scanning frequency of primary charged-particle beam 210 may be constant. FIG. 7A is an illustration of an exemplary scanning frequency of beam tool 500, consistent with embodiments of the present disclosure. In FIG. 7A, the horizontal axis represents a timeline including timestamps t1 to t4 and t1', and the vertical axis represents a deflection voltage of deflection scanning unit 226. FIG. 7A shows a relationship between the deflection voltage and time when the scanning manner is a raster manner. For example, from t1 to t1', the deflection voltage increases, and deflection scanning unit 226 may direct primary charged-particle beam 210 to scan from left to right along line 602. From t1' to t2, the deflection voltage decreases, and deflection scanning unit 226 may direct primary charged-particle beam 210 to move back to the left end. When controller 109 is configured to control emission booster 502 to scan the same line (e.g., line 602 in FIG. 6) of the sample in the first cycle and the second cycle, during the same time between t1' to t2, deflection scanning unit 226 may direct primary charged-particle beam 210 to move back to the left end. Between t2 and t3, deflection scanning unit 226 may direct primary charged-particle beam 210 to scan from left to right along line 602 and move back to the left end. When controller 109 is configured to control emission booster 502 to scan a first line (e.g., line 602) in the first cycle (e.g., from t1 to t2) and to scan a second line (e.g., line 604) in the second cycle (e.g., from t2 to t3), during the same time between t1' to t2, a motorized wafer stage (e.g., motorized wafer stage 280) may move wafer 230 one line apart to prepare for scanning line 604, and deflection scanning unit 226 may direct primary charged-particle beam 210 to move back to the left end. From t2 to t3, deflection scanning unit 226 may direct primary charged-particle beam 210 to scan from left to right along line 604 and move back to the left end. It should be noted that, although the above description assumes a left-to-right scan, the actual scanning direction may be along any direction and is not limited to the described examples.

In some embodiments, deflection scanning unit 226 may direct primary charged-particle beam 210 to perform the raster scan in substantially equal cycles. For example, (t2−t1), (t3−t2), and (t4−t3) may be substantially equal, in which a difference between each other may be smaller than or equal to a threshold time difference (e.g., 10, 20, 40, 60 nanoseconds or the like). It can be shown in FIG. 7A that the amount of time (e.g., t2−t1) for scanning the first line (e.g., line 602) may be substantially equal to the amount of time (e.g., t3−t2) for scanning the second line (e.g., line 604). In some embodiments, the raster scan may be performed in non-equal cycles. For example, the first line may be scanned under a high current faster than the second line scanned under a low current, or the first line may be scanned under the high current slower than the second line scanned under the low current.

Figure 7B:
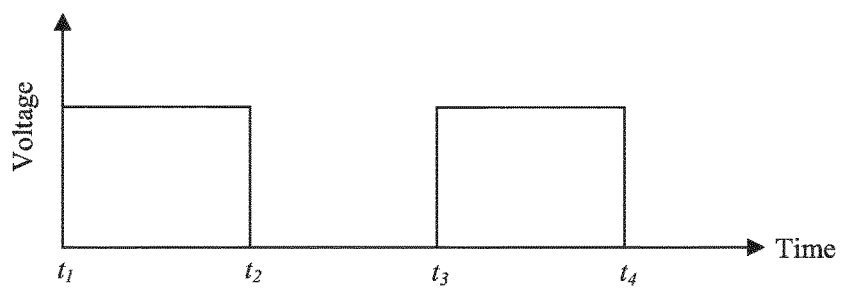
FIG. 7B is an illustration of an exemplary irradiation frequency of an emission booster of the beam tool in FIG. 7A, consistent with embodiments of the present disclosure.

FIG. 7B is an illustration of an exemplary irradiation frequency of emission booster 502, consistent with embodiments of the present disclosure. In FIG. 7A, the horizontal axis represents a timeline including timestamps t1 to t4, and the vertical axis represents an operation voltage of emission booster 502 (e.g., a pulse laser generator). From t1 to t2, the operation voltage may be switched on, and emission booster 502 may irradiate electromagnetic radiation 504 onto charged-particle source 202. From t2 to t3, the operation voltage may be switched off, and emission booster 502 may stop irradiating electromagnetic radiation 504 onto charged-particle source 202. When emission booster 502 irradiates electromagnetic radiation 504 onto charged-particle source 202, primary charged-particle beam 210 may have a high current due to the photoelectric or photoemission effect. When emission booster 502 stops irradiating electromagnetic radiation 504 onto charged-particle source 202, primary charged-particle beam 210 may have a low current.

In some embodiments, as shown in FIGS. 7A-7B, controller 109 may synchronize the electron emission of emission booster 502 with deflection scanning unit 226 such that the electron beam has the high current when the electron beam starts (e.g., at t1) scanning the first line (e.g., line 602) and has the low current when the electron beam starts (e.g., at t2) scanning the second line (e.g., line 604). No matter whether the first line and the second line are scanned in substantially equal or non-equal cycles, controller 109 may synchronize the electron emission of emission booster 502 to irradiate electromagnetic radiation 504 or stop irradiating electromagnetic radiation 504 with the starting time of such cycles, such that any line of frame 600 may be scanned entirely by a high current beam or a low current beam.

In some embodiments, controller 109 may control emission booster 502 to stop irradiating electromagnetic radiation 504 in a third cycle of the scanning operation and may control deflection scanning unit 226 to scan the same line of the sample in the second cycle and the third cycle. For example, controller 109 may control emission booster 502 and deflection scanning unit 226 to scan line 602 with a high current in the first cycle t1 to t2 and to scan line 602 again with a low current in the second cycle t2 to t3, as shown and described in FIGS. 7A-7B. In the third cycle t3 to t4, controller 109 may control emission booster 502 and deflection scanning unit 226 to scan line 602 again with a low current (not shown in FIGS. 7A-7B). That is, controller 109 may control emission booster 502 to stop irradiating electromagnetic radiation 504 in the third cycle t3 to t4. In some embodiments, for the same line, a scan with a high current may be followed by a plurality of scans with a low current. From the plurality of scans with the low currents, a series of voltage contrast images may be generated for defect inspection, such as voltage contrast images 462-470 in FIG. 4B.

A detection system (e.g., including secondary optical system 242 and detection device 244) associated with beam tool 500 may generate a signal in response to receiving electrons (e.g., secondary electrons or backscattered electrons) exiting from a sample (e.g., wafer 230). The signal may include a first type of signal when primary charged-particle beam 210 has a high current and a second type of signal when primary charged-particle beam 210 has a low current. An imaging processing system (e.g., image processing system 290) associated with beam tool 500 may generate an image indicative of a test device region (e.g., test device region 430 or 440 in FIG. 4A) of the sample based on the signal. For example, the image processing system may generate a first image (a "high-current image") based on the first type of signal and a second image (a "low-current image") based on the second type of signal. The first and second images may be voltage contrast images that indicate voltage contrast responses. Because of the different beam currents, the voltage contrast responses in the generated voltage contrast images may be different. By comparing the generated voltage contrast images, voltage contrast defects of the test device region may be identified without difficulty.

For example, as shown in FIG. 6, controller 109 is configured to control emission booster 502 to scan a first line (e.g., line 602) in the first cycle (e.g., from t1 to t2) and to scan a second line (e.g., line 604) in the second cycle (e.g., from t2 to t3). Lines 602, 606, and 610 may be scanned using a high-current beam (indicated as bold lines), and lines 604, 608, and 612 may be scanned using a low-current beam (indicated as thin lines). The detection system may receive exiting electrons (e.g., secondary electrons or backscattered electrons) from lines 602-612, and generate signals that may be categorized into at least two types, a first type including signals generated corresponding to lines 602, 606, and 610, and a second type including signals generated corresponding to lines 604, 608, and 612. The image processing system may receive the first type of signals and generate a high-current image and receive the second type of signals and generate a low-current image. In FIG. 6, lines of frame 600 are scanned under high and low beam currents alternately. Correspondingly, the generated high-current and low-current images may be interlaced-scan images.

For another example, controller 109 may be configured to control emission booster 502 to scan the same line (e.g., line 602) in the first cycle (e.g., from t1 to t2) and the second cycle (e.g., from t2 to t3). Each line (e.g., lines 602-612 of frame 600) may be scanned using a high-current beam for a first time and a low-current beam for a second time. The detection system may receive exiting electrons (e.g., secondary electrons or backscattered electrons) from each scan, and generate signals that may be categorized into at least two types, a first type including signals generated corresponding to the high-current beam scans, and a second type including signals generated corresponding to the low-current beam scans. The image processing system may receive the first type of signals and generate a high-current image and receive the second type of signals and generate a low-current image. Each line of frame 600 may be scanned under high and low beam currents before the next line is scanned. Correspondingly, the generated high-current and low-current images may be progressive-scan images. It should be noted that this disclosure does not limit whether the generated images are interlaced- or progressive-scan images.

Due to ultra-fast response of the photoelectric or photoemission effect, by using emission booster 502 (e.g., a laser generator), beam currents of primary charged-particle beam 210 may be adjusted in ultra-fast time (e.g., in an order of nanoseconds), which greatly reduces the time needed for beam current adjustment in existing beam tools. Alternately, beam currents of primary charged-particle beam 210 may be adjusted in slower time (e.g., in an order of microseconds, milliseconds, etc.). By synchronizing emission booster 502 with deflection scanning unit 226, irradiation of electromagnetic radiation 504 may be synchronized with a scanning frequency of deflection scanning unit 226, in which each line of a frame scanning may be entirely scanned under a beam having the same current (e.g., a high current or a low current). With such scan manner under ultra-fast beam current adjustment, high-current images and low-current images may be generated in ultra-fast time, which may greatly improve voltage contrast defect inspection.

In some embodiments, controller 109 may inspect a voltage contrast defect by comparing the high- and low-current images. For example, controller 109 may determine whether a voltage contrast defect associated with the test device region exists based on a change of grayscale level of the same region indicative of the test device region in the high- and low-current images. If the change exceeds a predetermined threshold, controller 109 may determine that the test device region includes a potential voltage contrast defect, based on the principles as described in association with FIG. 4A.

In some embodiments, controller 109 may generate a fused image indicative of the test device region based on the high- and low-current images for other defect inspection, such as a D2D inspection or a die-to-database ("D2DB") inspection. For example, controller 109 may implement an exposure fusion technique to generate a high dynamic range (HDR) image using the high- and low-current images. The HDR image may have a dynamic range higher than that of the high-current image and that of the low-current image. Compared with the high- or low-current image, the HDR image may have a wider range of intensity details and lower noise, which may provide more information for defect inspection.

In some embodiments, emission booster 502 may be configured to provide at least two levels of power of electromagnetic radiation 504. For example, by setting operation voltage or current, emission booster 502 (e.g., a pulse laser generator) may provide a first level of power and a second level of power for electromagnetic radiation 504, in which the first level of power is higher than the second level of power. Correspondingly, under the first level of power of electromagnetic radiation 504, charged-particle source 202 may be boosted to emit more electrons than in a case under the second level of power of electromagnetic radiation 504. As a result, primary charged-particle beam 210 may have three levels of beam currents: a first high current, a second high current lower than the first high current, and a low current, corresponding to emission booster 502 under the first level of power, the second level of power, and switched off, respectively. By providing more levels of beam currents, beam tool 500 may provide more images indicative of more variations of voltage contrast responses, thus provide more information for voltage contrast defect inspection. It should be noted that this disclosure does not limit the number of levels of power emission booster 502 may provide.

Figure 8:
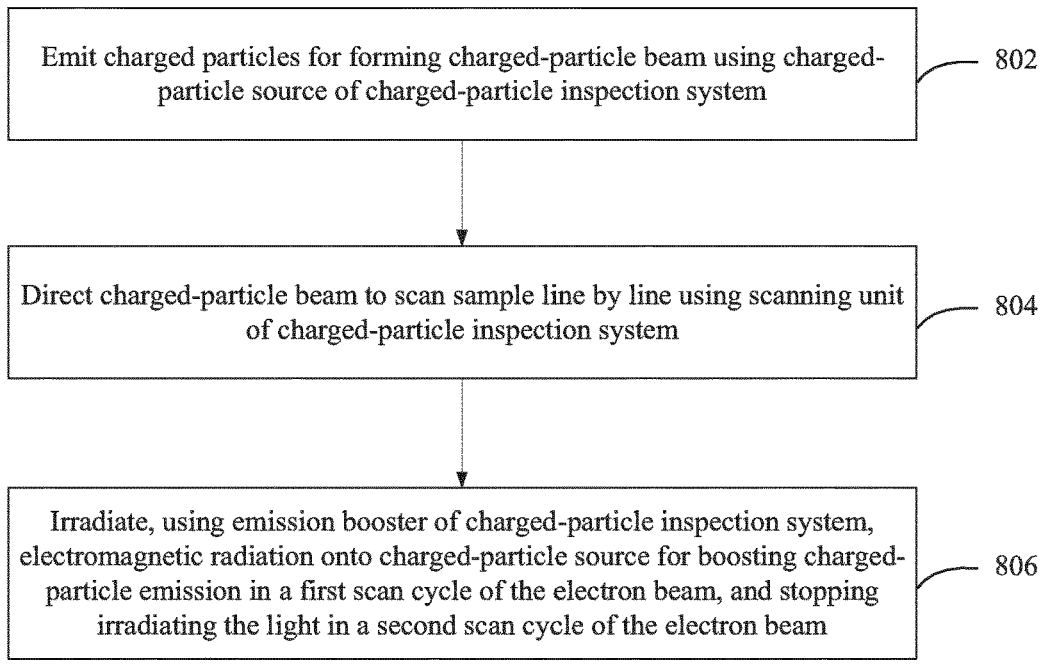
FIG. 8 is a flowchart of an exemplary method of defect inspection for a charged-particle inspection system, consistent with embodiments of the present disclosure.
Figure 9:
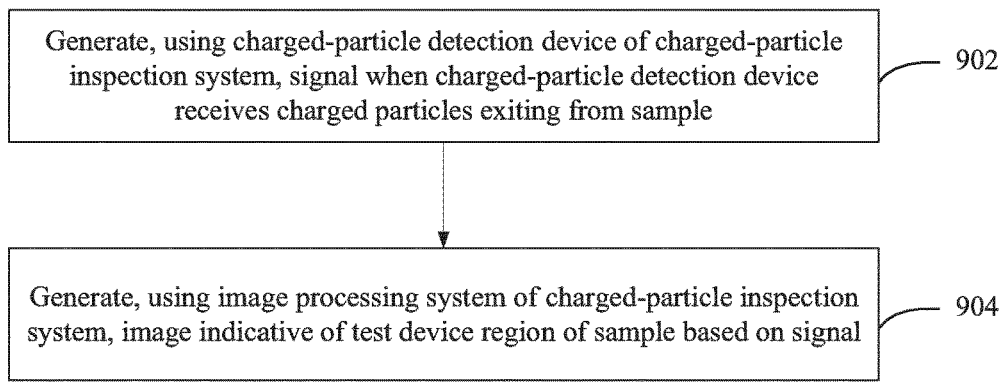
FIG. 9 is a flowchart of another exemplary method of defect inspection for a charged-particle inspection system, consistent with embodiments of the present disclosure.

FIGS. 8-9 are flowcharts of exemplary methods 800 and 900 of defect inspection for a charged-particle inspection system, consistent with embodiments of the present disclosure. Methods 800 and 900 may be performed by a controller of the charged-particle inspection system (e.g., EBI system 100 in FIG. 1 or beam tool 500 in FIG. 5). The controller may include circuitry (e.g., a memory and a processor) programmed to implement methods 800 and 900. For example, the controller may be an internal controller or an external controller (e.g., controller 109 in FIGS. 1-2 and 5) coupled with the charged-particle inspection system. Methods 800 and 900 may be connected to the operations and steps shown and described in FIGS. 3-7B.

In FIG. 8, at step 802, the controller (e.g., controller 109 in FIG. 5) may control an charged-particle source (e.g., charged-particle source 202 in FIG. 5) of a charged-particle inspection system (e.g., beam tool 500 in FIG. 5) to emit electrons for forming an electron beam (e.g., primary charged-particle beam 210 in FIG. 5). In some embodiments, the charged-particle source may be a thermionic charged-particle source. In some embodiments, the charged-particle source may be a cold-field emission charged-particle source. In some embodiments, the charged-particle source may include a photocathode. The charged-particle source may be any component that can be configured to emit electrons. While the disclosed method utilizes a charged-particle source to emit electrons, it is appreciated that the method may more generally utilize a charged particle source to emit charged particles.

At step 804, the controller may control a scanning unit (e.g., deflection scanning unit 226 in FIG. 5) of the charged-particle inspection system to direct the electron beam to perform a line-by-line scan. For example, the line-by-line scan may be performed on a sample (e.g., wafer 230 in FIG. 5).

At step 806, the controller may control an emission booster (e.g., emission booster 502 in FIG. 5) of the charged-particle inspection system to irradiate electromagnetic radiation (e.g., electromagnetic radiation 504 in FIG. 5) onto the charged-particle source for boosting electron emission in a first scan cycle of the electron beam, and to stop irradiating the electromagnetic radiation in a second scan cycle of the electron beam. The electron beam may have a first current (referred to as a "high current") when the emission booster irradiates the electromagnetic radiation onto the charged-particle source and a second current (referred to as a "low current") lower than the first current when the emission booster stops irradiating the electromagnetic radiation onto the charged-particle source. In some embodiments, the emission booster may be a laser generator configured to irradiate a laser (e.g., a pulse laser). For example, the controller may control the laser generator to irradiate the laser onto the photocathode of the emission booster for increasing electrons emitted by the photocathode. The electromagnetic radiation-induced emission boosting may be ultra-fast. For example, the laser may boost electron emission within 70 nanoseconds when the laser generator irradiates the laser onto the photocathode.

In some embodiments, the scanning unit may direct the electron beam to scan the same line of a sample in the first scan cycle and the second scan cycle. In some embodiments, the scanning unit may direct the electron beam to scan a first line of the sample in the first scan cycle and to scan a second line of the sample in the second scan cycle. In some embodiments, a length of the first scan cycle may be substantially equal to a length of the second scan cycle. For example, as shown in FIG. 7A, the amount of time for scanning the first line (e.g., line 602) may be (t2−t1), and the amount of time for scanning the second line (e.g., line 604) may be (t3−t2), and (t2−t1) and (t3−t2) may be substantially equal, in which a difference between each other may be smaller than or equal to a threshold time difference (e.g., 10, 20, 40, 60 nanoseconds or the like). Also, as shown in FIG. 7B, from t1 to t2, the electron beam scans the first line, and the emission booster irradiates the electromagnetic radiation. From t2 to t3, the electron beam scans the second line, and the emission booster stops irradiating the electromagnetic radiation. It should be noted that the amount of time for scanning the first and second lines may be non-equal, in which lines scanned under high- or low-currents may have different scanning speeds.

In some embodiments, the controller may synchronize the electron emission of the emission booster with the scanning unit such that the electron beam has the first current when the electron beam starts scanning the first line and has the second current when the electron beam starts scanning the second line. For example, as shown in FIGS. 7A-7B, primary charged-particle beam 210 has the high current when it starts scanning line 602 at timestamp t1 and has the low current when it starts scanning line 604 at timestamp t2.

In some embodiments, the controller may control the scanning unit to scan the sample in a progressive scan mode, in which each line of the sample may be scanned twice by the high- and low-current beams, respectively, before the electron beam is directed to scan the next line. In some embodiments, the controller may control the scanning unit to scan the sample in an interlaced scan mode, in which each line of the frame may be scanned for once by the high- and low-current beams alternately. For example, the first line and the second line may be neighboring lines (e.g., lines 602 and 604 in FIG. 6) of a frame (e.g., frame 600 in FIG. 6) for scanning.

FIG. 9 is a flowchart of an exemplary method 900 of defect inspection for a charged-particle inspection system, consistent with embodiments of the present disclosure. Method 900 may be a standalone method or associated with method 800. For example, the controller may perform method 900 after performing step 806 of method 800.

At step 902, a controller (e.g., controller 109 in FIG. 5) controls an charged-particle detection device (e.g., charged-particle detection device 244 in FIG. 2) of the charged-particle inspection system to generate a signal when the charged-particle detection device receives electrons (e.g., secondary electrons or backscattered electrons) exiting from the sample (e.g., wafer 230 in FIG. 5). In some embodiments, the charged-particle detection device may generate a first type of signal when the electron beam has the first current (e.g., the high current) and a second type of signal when the electron beam has the second current (e.g., the low current). For example, as shown in FIG. 6, when primary charged-particle beam 210 scans line 602 in a high current, the charged-particle detection device may generate the first type of signal. When primary charged-particle beam 210 scans line 604 in a low current, the charged-particle detection device may generate the second type of signal.

At step 904, the controller may control an image processing system (e.g., image processing system 290 in FIG. 2) of the charged-particle inspection system to generate an image indicative of a test device region (e.g., test device region 430 or 440 in FIG. 4A) of the sample based on the signal. In some embodiments, the image processing system may generate a first image (e.g., the high-current image as previously described in FIGS. 5-8) based on the first type of signal and a second image (e.g., the low-current image as previously described in FIGS. 5-8) based on the second type of signal. For example, the first image may be generated based on signals detected corresponding to lines 602, 606, and 610 in FIG. 6, and the second image may be generated based on signals detected corresponding to lines 604, 608, and 612 in FIG. 6, or corresponding to a second scan of lines 602, 606, and 610 in FIG. 6.

In some embodiments, the image processing system may generate a third image (e.g., the fused image as previously described in FIGS. 5-8) indicative of the test device region based on the first image and the second image. For example, the third image may have a dynamic range higher than a dynamic range of the first image and a dynamic range of the second image.

In some embodiments, the controller may further determine whether a voltage contrast defect associated with the test device region exists based on a change of grayscale level of the same region indicative of the test device region in the first image and the second image. If the change exceeds a predetermined threshold, controller 109 may determine that the test device region includes a potential voltage contrast defect, based on the principles as described in association with FIG. 4A.

The embodiments may further be described using the following clauses:

1. A charged-particle inspection system, the system comprising:
   a charged-particle source configured to emit charged particles for scanning a sample; and
   an emission booster configured to irradiate electromagnetic radiation onto the charged-particle source for boosting charged-particle emission in a first cycle of a scanning operation of the charged-particle inspection system, and to stop irradiating the electromagnetic radiation in a second cycle of the scanning operation.
2. The system of clause 1, wherein the charged particle inspection system is configured to scan the same line of the sample in the first cycle and the second cycle.
3. The system of clause 1, wherein the charged particle inspection system is configured to scan a first line of the sample in the first cycle and to scan a second line of the sample in the second cycle.
4. The system of clause 3, wherein the first line and the second line are neighboring lines of a frame for scanning.
5. The system of any of preceding clauses, wherein a length of the first cycle is substantially equal to a length of the second cycle.
6. The system of any of preceding clauses, wherein the charged-particle inspection system is configured to generate a charged-particle beam for scanning the sample, wherein the charged-particle beam is configured to have a first current when the emission booster irradiates the electromagnetic radiation onto the charged-particle source and a second current lower than the first current when the emission booster stops irradiating the electromagnetic radiation onto the charged-particle source.
7. The system of clause 6, wherein the charged-particle emission of the emission booster is configured to synchronize with a scanning operation of the charged-particle inspection system such that the charged-particle beam has the first current when the charged-particle beam starts scanning the first line and has the second current when the charged-particle beam starts scanning the second line.
8. The system of any of preceding clauses, wherein the charged-particle source is one of a thermionic charged-particle source or a cold-field emission charged-particle source.
9. The system of any of preceding clauses, wherein the charged-particle source comprises a photocathode.
10. The system of clause 9, wherein the emission booster comprises a laser generator configured to irradiate a laser.
11. The system of clause 10, wherein the laser generator is configured to irradiate the laser onto the photocathode for increasing charged particles emitted by the photocathode.
12. The system of clause 11, wherein the laser boosts charged-particle emission within 70 nanoseconds when the laser generator irradiates the laser onto the photocathode.
13. The system of any of preceding clauses, wherein the emission booster is further configured to stop irradiating the electromagnetic radiation in a third cycle of the scanning operation, and the charged particle inspection system is further configured to scan the same line of the sample in the second cycle and the third cycle.
14. The system of any of preceding clauses, wherein the charged particle inspection system is a single-beam inspection system.
15. The system of any of clauses 1-13, wherein the charged particle inspection system is a multi-beam inspection system.
16. The system of any of preceding clauses, wherein the charged particles comprise electrons.
17. A charged-particle inspection system, the system comprising:
    a charged-particle source configured to emit charged particles;
    an emission booster configured to irradiate electromagnetic radiation onto the charged-particle source for boosting charged-particle emission;
    a beam forming unit configured to form a charged-particle beam using the charged particles;
    a scanning unit configured to direct the charged-particle beam to scan a sample line by line; and
    a controller comprising circuitry configured to control the emission booster to irradiate the electromagnetic radiation in a first scan cycle of the charged-particle beam, and to stop irradiating the electromagnetic radiation in a second scan cycle of the charged-particle beam.
18. The system of clause 17, wherein the charged-particle beam is configured to scan the same line of the sample in the first scan cycle and the second scan cycle.
19. The system of clause 17, wherein the charged-particle beam is configured to scan a first line of the sample in the first scan cycle and to scan a second line of the sample in the second scan cycle.
20. The system of clause 19, wherein the first line and the second line are neighboring lines of a frame for scanning.
21. The system of any of clauses 17-20, wherein a length of the first scan cycle is substantially equal to a length of the second scan cycle.
22. The system of any of clauses 17-21, wherein the charged-particle beam is configured to have a first current when the emission booster irradiates the electromagnetic radiation onto the charged-particle source and a second current lower than the first current when the emission booster stops irradiating the electromagnetic radiation onto the charged-particle source.
23. The system of any of clauses 17-22, wherein the charged-particle emission of the emission booster is configured to synchronize with the scanning unit such that the charged-particle beam has the first current when the charged-particle beam starts scanning the first line and has the second current when the charged-particle beam starts scanning the second line.

24. The system of any of clauses 17-23, wherein the charged-particle source is one of a thermionic charged-particle source or a cold-field emission charged-particle source.

25. The system of any of clauses 17-24, wherein the charged-particle source comprises a photocathode.

26. The system of clause 25, wherein the emission booster comprises a laser generator configured to irradiate a laser.

27. The system of clause 26, wherein the laser generator is configured to irradiate the laser onto the photocathode for increasing charged particles emitted by the photocathode.

28. The system of clause 27, wherein the laser boosts charged-particle emission within 70 nanoseconds when the laser generator irradiates the laser onto the photocathode.

29. The system of any of clauses 17-28, further comprising:
a charged-particle detection device configured to generate a signal in response to receiving charged particles exiting from the sample; and
an image processing system configured to generate an image indicative of a test device region of the sample based on the signal.

30. The system of clause 29, wherein the signal comprises a first type of signal when the charged-particle beam has the first current and a second type of signal when the charged-particle beam has the second current.

31. The system of clause 30, wherein the image processing system is further configured to generate a first image based on the first type of signal and a second image based on the second type of signal.

32. The system of clause 31, wherein the image processing system is further configured to generate a third image indicative of the test device region based on the first image and the second image.

33. The system of clause 32, wherein the third image has a dynamic range higher than a dynamic range of the first image and a dynamic range of the second image.

34. The system of clause 31, wherein the controller is further configured to:
determine whether a voltage contrast defect associated with the test device region exists based on a change of gray scale level of the same region indicative of the test device region in the first image and the second image.

35. The system of any of clauses 17-34, wherein the beam forming unit is further configured to form a plurality of charged-particle beams using the charged particles.

36. The system of any of clauses 17-34, wherein the beam forming unit is configured to form a plurality of charged-particle beams.

37. The system of any of clauses 17-36, wherein the emission booster is further configured to stop irradiating the electromagnetic radiation in a third scan cycle of the charged-particle beam, and the charged-particle beam is further configured to scan the same line of the sample in the second scan cycle and the third scan cycle.

38. The system of any of clauses 17-37, wherein the charged particles comprise electrons.

39. A method comprising:
emitting charged particles for forming a charged-particle beam using a charged-particle source of a charged-particle inspection system;
directing the charged-particle beam to perform a line-by-line scan using a scanning unit of the charged-particle inspection system; and
irradiating, using an emission booster of the charged-particle inspection system, electromagnetic radiation onto the charged-particle source for boosting charged-particle emission in a first scan cycle of the charged-particle beam; and
stopping irradiating the electromagnetic radiation in a second scan cycle of the charged-particle beam.

40. The method of clause 39, wherein directing the charged-particle beam to perform the line-by-line scan comprises:
directing the charged-particle beam to scan the same line of a sample in the first scan cycle and the second scan cycle.

41. The method of clause 39, wherein directing the charged-particle beam to perform the line-by-line scan comprises:
directing the charged-particle beam to scan a first line of a sample in the first scan cycle and to scan a second line of the sample in the second scan cycle.

42. The method of clause 41, wherein the first line and the second line are neighboring lines of a frame for scanning.

43. The method of any of clauses 39-40, wherein a length of the first scan cycle is substantially equal to a length of the second scan cycle.

44. The method of any of clauses 39-42, wherein the charged-particle beam is configured to have a first current when the electromagnetic radiation is irradiated onto the charged-particle source and a second current lower than the first current when the electromagnetic radiation is stopped from irradiating onto the charged-particle source.

45. The method of any of clauses 39-44, further comprising:
synchronizing the emission booster with the scanning unit such that the charged-particle beam has the first current when the charged-particle beam starts scanning the first line and has the second current when the charged-particle beam starts scanning the second line.

46. The method of any of clauses 39-45, wherein the charged-particle source is one of a thermionic charged-particle source or a cold-field emission charged-particle source.

47. The method of any of clauses 39-46, wherein the charged-particle source comprises a photocathode.

48. The method of clause 47, wherein the emission booster comprises a laser generator configured to irradiate a laser.

49. The method of clause 48, further comprising:
irradiating, using the laser generator, the laser onto the photocathode for increasing charged particles emitted by the photocathode.

50. The method of clause 49, wherein the laser boosts charged-particle emission within 70 nanoseconds when the laser generator irradiates the laser onto the photocathode.

51. The method of any of clauses 39-50, further comprising:
generating, using a charged-particle detection device of the charged-particle inspection system, a signal when the charged-particle detection device receives charged particles exiting from the sample; and generating, using an image processing system of the charged-particle inspection system, an image indicative of a test device region of the sample based on the signal.

52. The method of clause 51, wherein generating the signal comprises:
generating a first type of signal when the charged-particle beam has the first current and a second type of signal when the charged-particle beam has the second current.

53. The method of clause 52, wherein generating the image comprises:
generating a first image based on the first type of signal and a second image based on the second type of signal.

54. The method of clause 53, wherein generating the image comprises:
generating a third image indicative of the test device region based on the first image and the second image.

55. The method of clause 54, wherein the third image has a dynamic range higher than a dynamic range of the first image and a dynamic range of the second image.

56. The method of clause 53, further comprising:
determining whether a voltage contrast defect associated with the test device region exists based on a change of gray scale level of the same region indicative of the test device region in the first image and the second image.

57. The method of any of clauses 39-56, further comprising:
stopping irradiating the electromagnetic radiation in a third scan cycle of the charged-particle beam.

58. The method of clause 55, wherein directing the charged-particle beam to perform the line-by-line scan comprises:
directing the charged-particle beam to scan the same line of the sample in the second cycle and the third cycle.

59. The method of any of clauses 39-58, wherein the charged particle inspection system is a single-beam inspection system.

60. The method of any of clauses 39-58, wherein the charged particle inspection system is a multi-beam inspection system.

61. The system of any of clauses 39-59, wherein the charged particles comprise electrons.

62. A non-transitory computer-readable medium that stores a set of instructions that is executable by at least one processor of a charged-particle inspection system to cause the system to perform a method of defect inspection, the method comprising:
emitting charged particles for forming a charged-particle beam using a charged-particle source of the charged-particle inspection system;
directing the charged-particle beam to perform a line-by-line scan using a scanning unit of the charged-particle inspection system; and
irradiating, using an emission booster of the charged-particle inspection system, electromagnetic radiation onto the charged-particle source for boosting charged-particle emission in a first scan cycle of the charged-particle beam, and stopping irradiating the electromagnetic radiation in a second scan cycle of the charged-particle beam.

A non-transitory computer-readable medium may be provided that stores instructions for a processor of a controller (e.g., controller 109 in FIGS. 1 and 5) for defect inspection according to the exemplary flowcharts of FIGS. 8-9 above, consistent with embodiments in the present disclosure. For example, the instructions stored in the non-transitory computer-readable medium may be executed by the circuitry of the controller for performing method 800 or 900 in part or in entirety. Common forms of non-transitory media include, for example, a floppy disk, a flexible disk, hard disk, solid-state drive, magnetic tape, or any other magnetic data storage medium, a Compact Disc Read-Only Memory (CD-ROM), any other optical data storage medium, any physical medium with patterns of holes, a Random Access Memory (RAM), a Programmable Read-Only Memory (PROM), and Erasable Programmable Read-Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A charged-particle inspection system, the system comprising:
a charged-particle source configured to emit charged particles for scanning a sample; and
an emission booster configured to irradiate electromagnetic radiation onto the charged-particle source for boosting charged-particle emission in a first cycle of a scanning operation of the charged-particle inspection system, and to stop irradiating the electromagnetic radiation in a second cycle of the scanning operation,
wherein the charged-particle inspection system is configured to scan an entire first line in a frame of the sample during the first cycle and scan an entire second line in the frame of the sample during the second cycle.

2. The system of claim 1, wherein the first line and the second line comprise the same line of the frame of the sample.

3. The system of claim 1, wherein the first line and the second line comprise different lines of the frame of the sample.

4. The system of claim 3, wherein the first line and the second line are neighboring lines of the frame of the sample.

5. The system of claim 1, wherein a length of the first cycle is substantially equal to a length of the second cycle.

6. The system of claim 1, wherein the charged-particle inspection system is configured to generate a charged-particle beam for scanning the sample, wherein the charged-particle beam is configured to have a first current when the emission booster irradiates the electromagnetic radiation onto the charged-particle source and a second current lower than the first current when the emission booster stops irradiating the electromagnetic radiation onto the charged-particle source.

7. The system of claim 6, wherein the charged-particle emission of the emission booster is configured to synchronize with a scanning operation of the charged-particle inspection system such that the charged-particle beam has the first current when the charged-particle beam starts scanning the first line and has the second current when the charged-particle beam starts scanning the second line.

8. The system of claim 1, wherein the charged-particle source is one of a thermionic charged-particle source or a cold-field emission charged-particle source.

9. The system of claim 1, wherein the charged-particle source comprises a photocathode.

10. The system of claim 9, wherein the emission booster comprises a laser generator configured to irradiate a laser.

11. The system of claim 10, wherein the laser generator is configured to irradiate the laser onto the photocathode for increasing charged particles emitted by the photocathode.

12. The system of claim 11, wherein the laser boosts charged-particle emission within 70 nanoseconds when the laser generator irradiates the laser onto the photocathode.

13. The system of claim 1, wherein the emission booster is further configured to stop irradiating the electromagnetic radiation in a third cycle of the scanning operation, and the charged particle inspection system is further configured to scan the second line in the second cycle and the third cycle.

14. The system of claim 1, wherein the charged particle inspection system is a single-beam inspection system.

15. A non-transitory computer-readable medium that stores a set of instructions that is executable by at least one processor of a charged-particle inspection system to cause the system to perform operations of defect inspection, the operations comprising:
   emitting charged particles for forming a charged-particle beam using a charged-particle source of the charged-particle inspection system;
   directing the charged-particle beam to perform a line-by-line scan using a scanning unit of the charged-particle inspection system;
   irradiating, using an emission booster of the charged-particle inspection system, electromagnetic radiation onto the charged-particle source for boosting charged-particle emission in a first scan cycle of the charged-particle beam, and stopping irradiating the electromagnetic radiation in a second scan cycle of the charged-particle beam; and
   scanning an entire first line in a frame of a sample during the first cycle and scanning an entire second line in the frame of the sample during the second cycle.

16. The non-transitory computer-readable medium of claim 15, wherein the charged particle beam is configured to have a first current when the emission booster irradiates the electromagnetic radiation onto the charged-particle source and a second current lower than the first current when the emission booster stops irradiating the electromagnetic radiation onto the charged-particle source.

17. The non-transitory computer-readable medium of claim 16, wherein the operations further comprise synchronizing the emission booster with a scanning operation of the charged-particle inspection system such that the charged-particle beam has the first current when the charged-particle beam starts scanning the first line and has the second current when the charged-particle beam starts scanning the second line.

18. The non-transitory computer-readable medium of claim 15, wherein the first line and the second line comprise a same line of the frame of the sample.

19. The non-transitory computer-readable medium of claim 18, wherein the first line and the second line comprise different lines of the frame of the sample.

20. A method, comprising:
   emitting charged particles for forming a charged-particle beam using a charged particle source of a charged-particle inspection system;
   directing the charged-particle beam to perform a line-by-line scan using a scanning unit of the charged-particle inspection system;
   irradiating, using an emission booster of the charged-particle inspection system, electromagnetic radiation onto the charged-particle source for boosting charged particle emission in a first scan cycle of the charged-particle beam, and stopping irradiating the electromagnetic radiation in a second scan cycle of the charged particle beam; and
   scanning an entire first line of a frame of the sample during the first cycle and scanning an entire second line of the frame of the sample during the second cycle.

* * * * *